(12) United States Patent
Williams

(10) Patent No.: US 12,385,760 B2
(45) Date of Patent: Aug. 12, 2025

(54) VERY LOW POWER CONTAMINANT DETECTION CIRCUIT

(71) Applicant: ACLARA TECHNOLOGIES LLC, St. Louis, MO (US)

(72) Inventor: Randy John Williams, Sandy, UT (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

(21) Appl. No.: 18/593,463

(22) Filed: Mar. 1, 2024

(65) Prior Publication Data

US 2024/0200981 A1    Jun. 20, 2024

Related U.S. Application Data

(63) Continuation of application No. 16/717,550, filed on Dec. 17, 2019, now Pat. No. 11,940,297.

(60) Provisional application No. 62/781,114, filed on Dec. 18, 2018.

(51) Int. Cl.
  *G01D 4/00* (2006.01)
  *G01D 3/036* (2006.01)
  *H05K 1/16* (2006.01)

(52) U.S. Cl.
  CPC ........... *G01D 3/0365* (2013.01); *G01D 4/002* (2013.01); *H05K 1/167* (2013.01); *H05K 2201/10196* (2013.01)

(58) Field of Classification Search
  CPC ...... G01D 4/002; G01D 3/0365; H05K 1/167; H05K 2201/10196
  See application file for complete search history.

(56) References Cited

U.S. PATENT DOCUMENTS

| | | |
|---|---|---|
| 8,325,057 B2 | 12/2012 | Salter |
| 8,489,342 B2 | 7/2013 | Dugger et al. |
| 2007/0284293 A1 | 12/2007 | Pitchford et al. |

(Continued)

FOREIGN PATENT DOCUMENTS

| | | | |
|---|---|---|---|
| GB | 2427280 A | * 12/2006 | ............... G01F 1/74 |
| WO | 2009/086432 A1 | 7/2009 | |

OTHER PUBLICATIONS

PCT/US2019/066880 International Search Report and Written Opinion dated Apr. 28, 2020 (14 pages).

(Continued)

*Primary Examiner* — Jeremy C Norris
(74) *Attorney, Agent, or Firm* — Michael Best & Friedrich LLP

(57) ABSTRACT

A contaminant detector is capable of sending a signal or alert when a contaminant is detected within a housing of a utility meter, a meter transmission unit (MTU), or other associated equipment. Circuitry enclosed within the housing is capable of detecting utility usage, transmitting information between one or more utility meters and a utility provider, and/or otherwise monitoring or tracking utility usage. The contaminant detector includes a resistive voltage divider network having a resistance that varies when in contact with a contaminant such as a form of water or metal. The variable resistor has a serpentine structure comprising a plurality of detective fingers that are formed from conductive material and separated by a non-conductive substance.

18 Claims, 5 Drawing Sheets

(56) References Cited

U.S. PATENT DOCUMENTS

| | | |
|---|---|---|
| 2009/0295462 A1 | 12/2009 | Itoh |
| 2011/0030482 A1 | 2/2011 | Meeusen et al. |
| 2013/0183437 A1 | 7/2013 | Bhakta et al. |
| 2015/0226583 A1 | 8/2015 | Aiken |
| 2017/0023461 A1 | 1/2017 | Hedayat et al. |
| 2017/0105369 A1 | 4/2017 | Shamley et al. |
| 2018/0294833 A1 | 10/2018 | Rose et al. |
| 2019/0027013 A1 | 1/2019 | Sale et al. |

OTHER PUBLICATIONS

Supplementary European Search Report dated Aug. 12, 2022 for corresponding European Application No. 19900774.1-1001.
Article 94(3) EPC Communication dated Apr. 6, 2023 for corresponding European Application No. 19900774.1-1001.
Mexican Patent Appl. No. MX/a/2021/007388 Office Action No. 45620 dated May 23, 2024(8 pages).

* cited by examiner

VERY LOW POWER CONTAMINANT DETECTION CIRCUIT

CROSS REFERENCE TO RELATED APPLICATIONS

This application claims the benefit of and claims priority to U.S. patent application Ser. No. 16/717,550, filed Dec. 17, 2019, which claims the benefit of and priority to Provisional Patent Application 62/781,114, filed on Dec. 18, 2018, both of which are incorporated herein by reference in their entirety.

FIELD

The certain embodiments of the disclosure relate to contaminant detection in utility meters or meter associated equipment.

BACKGROUND

Generally, a utility meter monitors consumption of a utility service such as electrical power, natural gas, or water. Aside from monitoring utility consumption, many utility meters are equipped with the ability to transmit utility usage and billing information to the utility company and customer. Alternatively, or in addition, utility meters communicate with a meter transmission unit (MTU) capable of providing the utility company with timely information regarding utility usage across a network of meters. By monitoring utility usage across larger region, anomalies such as meter tampering may be more easily detected.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Aspects of the present disclosure are directed to a utility meter transmission unit (MTU) comprising a housing, circuitry enclosed within the housing capable of transmitting information between one or more utility meters and a utility provider, and a contaminant detector capable of sending a signal or alert when a contaminant is detected within the housing.

In another aspect, a method of detecting a contaminant in metering equipment (e.g., a utility meter or meter transmission unit) is provided, the method comprising applying a voltage across a resistive voltage divider circuit housed within the metering equipment; the resistive voltage divider circuit comprising a variable resistor having a resistance that varies as a function of a contaminant; and measuring an output voltage across the variable resistor, wherein a change in the output voltage is indicative of the presence of the contaminant.

In another aspect, a method of detecting contaminant in a utility meter or meter transmission unit is provided, the method comprising applying a voltage across a resistive voltage divider circuit housed within the utility meter or meter transmission unit; the resistive voltage divider circuit comprising a variable resistor having a resistance that varies as a function of a contaminant; and measuring an output voltage across the variable resistor, wherein a decrease in the output voltage is indicative of the presence of the contaminant.

In yet another aspect of the present disclosure, a contaminant detecting device is provided, the contaminant detecting device comprising a resistive voltage divider, the resistive voltage divider comprising a constant resistor electrically coupled in series with a variable resistor and a voltage source thereacross, the variable resistor comprising a serpentine structure comprising a plurality of detective fingers formed from conductive material separated by a non-conductive substance, and wherein the overall resistance of the variable resistor when the serpentine structure is in contact with an contaminant is less than the overall resistance of the variable resistor when the serpentine structure is not in contact with the contaminant such that when contact with a contaminant the overall resistance of the variable resistor decreases and thus an output voltage of the resistive voltage divider decreases.

Other features will be in part apparent and in part pointed out hereinafter.

BRIEF DESCRIPTION OF THE DRAWINGS

Corresponding reference characters indicate corresponding parts throughout the drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Meter associated equipment is designed to operate with little external operation or maintenance while withstanding external weather/climate conditions such as precipitation, humidity and extreme temperatures. Because of this the meter associated equipment is vulnerable to contamination. A frequent problem experienced is the gradual or sudden accumulation of contaminants inside a meter or meter transmission unit, which can lead to premature battery failures, inaccurate meter readings, or other issues. This can be difficult to address because visual inspection often fails to identify problem areas before a problem has occurred. In addition, the cost associated with physically traveling to and inspecting a meter or meter transmission unit can be significant if no damage is observed. Therefore, there is a need for accurate and autonomous detection of contaminants in equipment associated with monitoring or transmitting utility usage as well as a way to notify the utility provider before a problem has occurred. This will allow for preemptive maintenance and result in significant cost and time savings overall.

The present disclosure is directed to a contaminant detection system, a meter transmission unit comprising a contaminant detection system and a method of detecting a contaminant within a utility meter or meter associated equipment (e.g., meter transmission unit).

Figure 1:
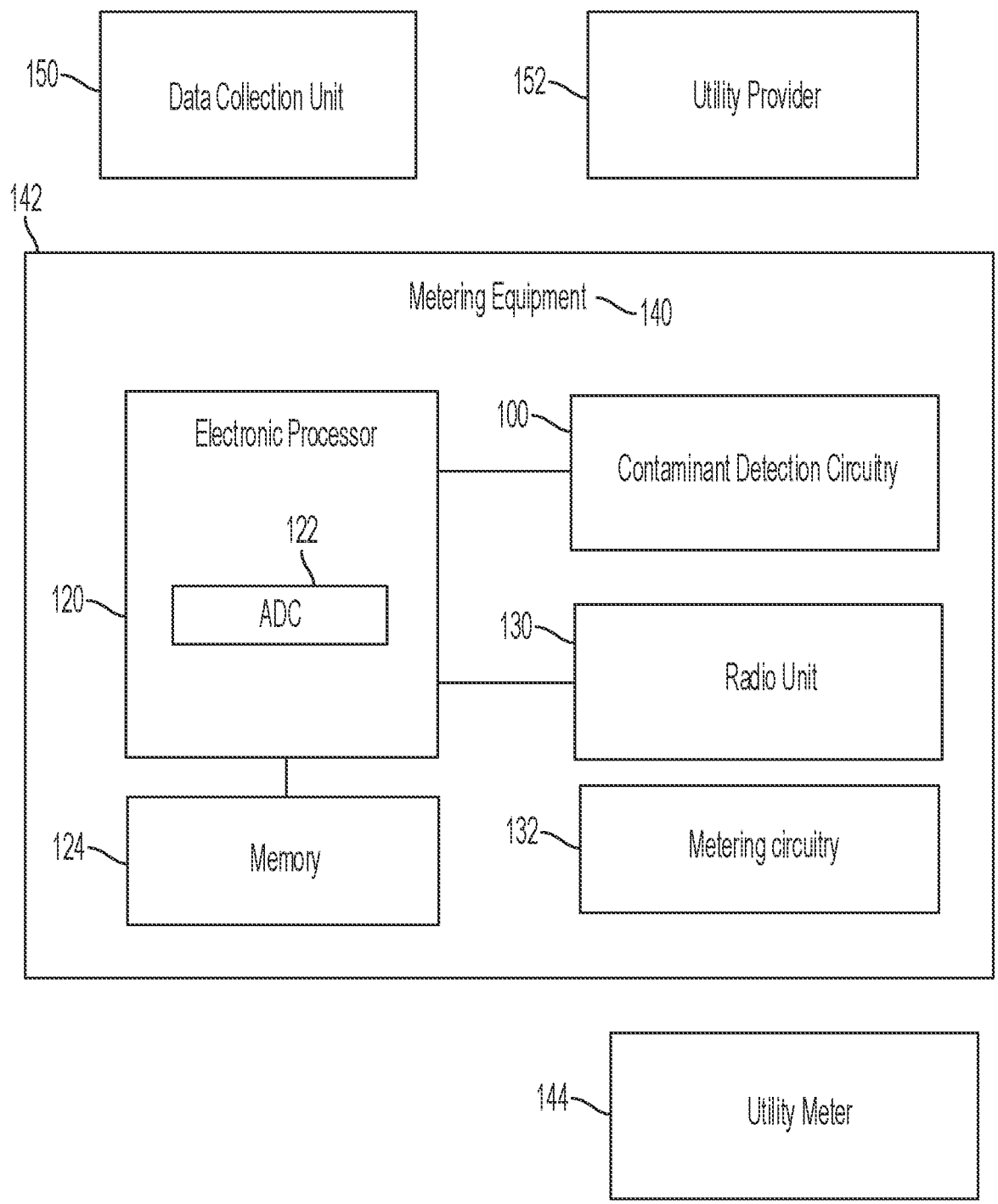
FIG. 1 is a block diagram of a contaminant detection system for metering equipment, according to an embodiment.

FIG. 1 is a block diagram of a contaminant detection system including metering equipment 140, a housing 142, contaminant detection circuitry 100 (i.e., contaminant detector 100), an electronic processor 120 (e.g., a microprocessor 120), an analog to digital converter (ADC) 122, a memory 124, a radio unit 130, and metering circuitry 132. Also shown in FIG. 1 is a utility meter 144, a data collection unit 150 and a utility provider 152. The electronic processor 120 is coupled to the contamination detection circuitry 100 and the radio unit 130. The electronic processor 120 receives output from the contaminant detection circuitry 100 via the ADC 122 and transmits information based on the output of the contaminant detection circuitry 100 to the utility provider 152, for example, via the data collection unit 150. The electronic processor 120 may also receive meter information from the metering circuitry 132 or the utility meter 144 and transmit the meter information to the utility provider 152, for example, via the data collection unit 150. The memory 124 stores instructions that are executed by the electronic processor 120 to perform the functions described herein. The metering equipment 140 may include a meter transmission unit and/or a utility meter. In some embodiments a meter transmission unit may be within the same housing 142 as the utility meter while in other embodiments, the meter transmission unit and utility meter may be located in separate housings 142. The metering equipment 140 may be referred to as a meter transmission unit 140, a utility meter 140, or the meter transmission unit and/or utility meter 140.

Figure 2:
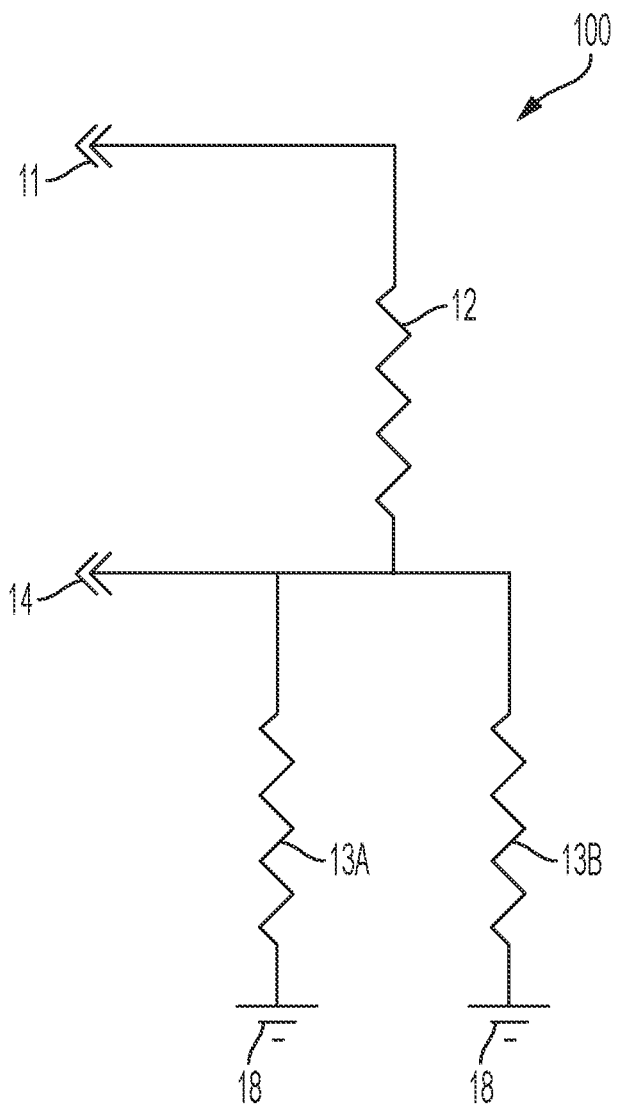
FIG. 2 is a schematic diagram of a voltage divider circuit for detecting contamination, according to an embodiment.

FIG. 2 is a schematic diagram of a voltage divider circuit of the contaminant detection circuitry 100 for detecting contamination in the metering equipment 140 (e.g., a meter transmission unit 140). The contaminant detection circuitry 100 comprises a resistive voltage divider circuit and may be referred to as a voltage divider circuit 100. As shown in FIG. 2, a representative voltage divider circuit 100 suitable for contaminant detection comprises a constant resistor 12 electrically connected, in series, with a variable resistor 13, and a voltage source may be connected thereacross from terminal 11 to ground 18. The variable resistor 13 is designed so that its resistance varies when it is in contact with a contaminant. In some embodiments, the variable resistor 13 includes a detection resistor 13A in parallel with a static resistor 13B. The detection resistor 13A may have a higher resistance than resistor 13B such that resistor 13B may not affect the voltage divider ratio to a significant level. Any change in the overall resistance of the variable resistor 13 is detectable as a change in the output voltage measured across terminal 14 to ground 18.

Figure 3:
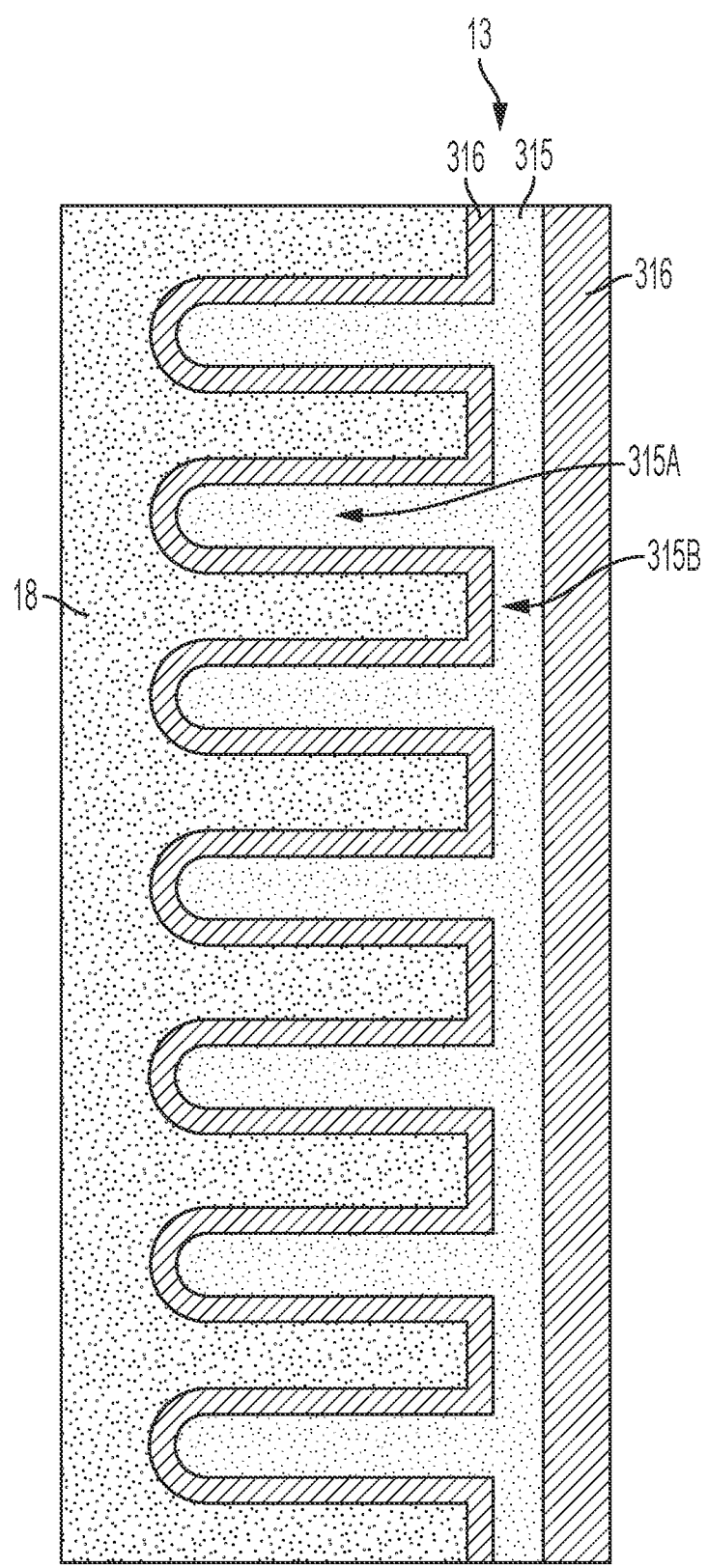
FIG. 3 illustrates the contaminant detection circuit of FIG. 2 embodied on a printed circuit board, according to an embodiment.

FIG. 3 illustrates the variable resistor 13 of the contaminant detection circuitry 100 of FIGS. 1 and 2 embodied on a printed circuit board. The variable resistor 13 (or a detection portion 13A of the variable resistor 13) in an embodiment comprises an elongated segment of conductive material 315 positioned within non-conductive material 316. The conductive material 315 can be shaped to form a serpentine structure having a plurality of detection fingers 315a arranged in close proximity. The fingers 315a are linked together by the conductive material 315b and are surrounded by the non-conductive material 316. The overall structure comprising the conductive material 315 and the non-conductive material 316 forms variable resistor 13. In some embodiments, in the absence of any contamination, the variable resistor 13 may have the same overall resistance as constant resistor 12. In other embodiments, the resistances may be different having a ratio of a desired voltage divider (e.g., using 5 V versus 3.6V). However, in the presence of contamination the overall resistance of the variable resistor 13 changes. Contaminants such as water, humidity, moisture, salts, dirt, or other organic and non-organic substances can form conductive bridges between the fingers 315a. This effectively reduces the pathway for current flow and therefore the overall resistance of the structure of the variable resistor 13. Variable resistor 13 is designed to be more sensitive to contaminants that have a lower resistance than the non-conductive material 316. Most contaminants encountered in the field would meet this criteria as they are largely comprised of aqueous and/or salt or electrolyte containing materials.

In an embodiment, the non-conductive material 316 comprises insulative material that may form a substrate of a printed circuit board (PCB) and the conductive material 315 may comprise a conductive trace deposited on the substrate, for example, in a serpentine pattern to form the variable resistor 13.

In general, the variable resistor 13 (FIG. 2) is constructed to meet certain criteria. As described in more detail below, the variable resistor 13 is designed so that its resistance can vary even in the presence of very small amounts of contamination. The fingers 315a serve to act both as the resistor and as connections for contamination. In other words, the physical separation between the fingers 315a (both the distance between them and their width) serve to dictate the sensitivity of the contamination detection circuitry 100. If the fingers 315a are too close to each other, the resistance might be too low. On the other hand, if the fingers 315a are positioned too far apart from each other, the contamination detection circuitry 100 might lose sensitivity and fail to detect relatively minute amounts of a contaminant (e.g., an amount that cannot bridge between the fingers).

In some embodiments, the fingers 315a are implemented by creating about 0.1 to about 0.3 mm wide traces separated by about 6 mm to about 8 mm linkage (e.g., conductive material 315b). More preferably, the traces are about 0.2 mm wide and are separated by about 7 mm linkage (e.g., conductive material 315b). In addition, a 0.2 mm spacing around the traces in all directions is maintained and the spacing is flooded with a non-conductive material 316. When constructed this way, the device forms alternating signal and ground fingers and increases the number of contacts that can be made with a possible contaminant. The conductive material 315 can be formed from any material having a known resistance. The conductive material 315 may be configured in other shapes that follow a criteria for trace separation and trace width that maintain the described sensitivity for detecting the small amounts of contaminants.

The voltage divider circuit 100 for contamination detection described with respect to FIGS. 1-4 is advantageously designed to draw a low amount of current during normal operation. This is achieved by using high value resistors (e.g., greater than 5MΩ, or about 10MΩ) as the constant resistor 12 and the variable resistor 13. Thus in normal operation, the contaminant detection circuitry 100 can operate using less than 200 nA of current. In fault conditions, the circuit would not exceed 400 nA (and preferably not exceed 360 nA).

Figure 4:
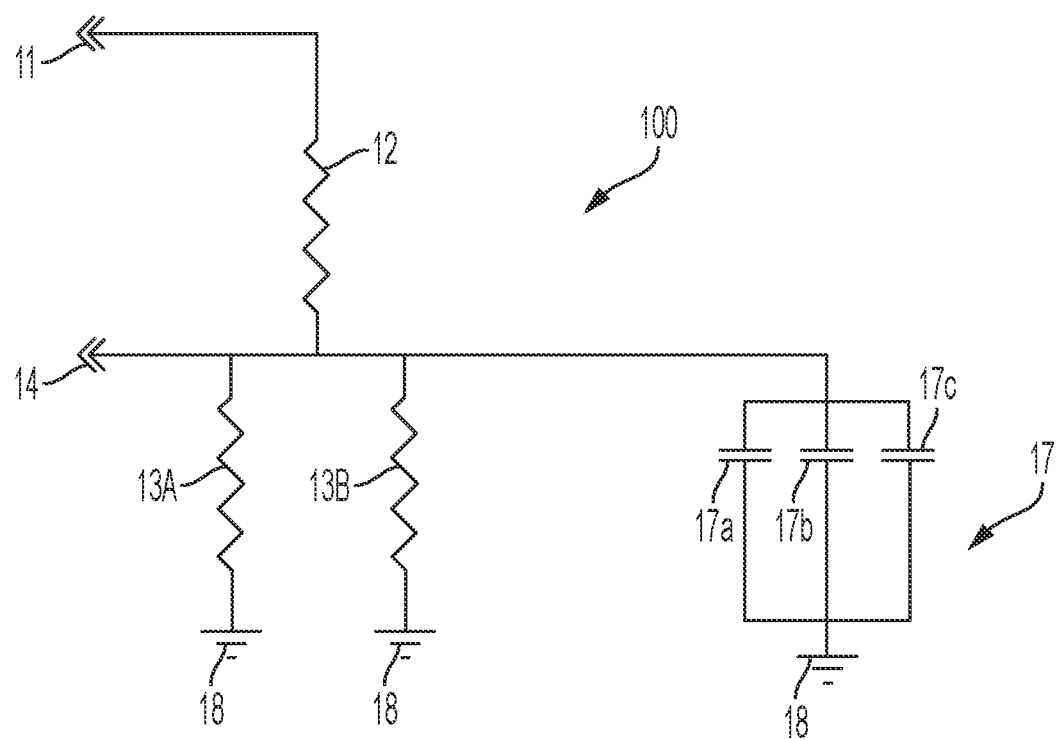
FIG. 4 is a schematic diagram of another example of the voltage divider circuit for detecting contamination, according to an embodiment.
Figure 5:
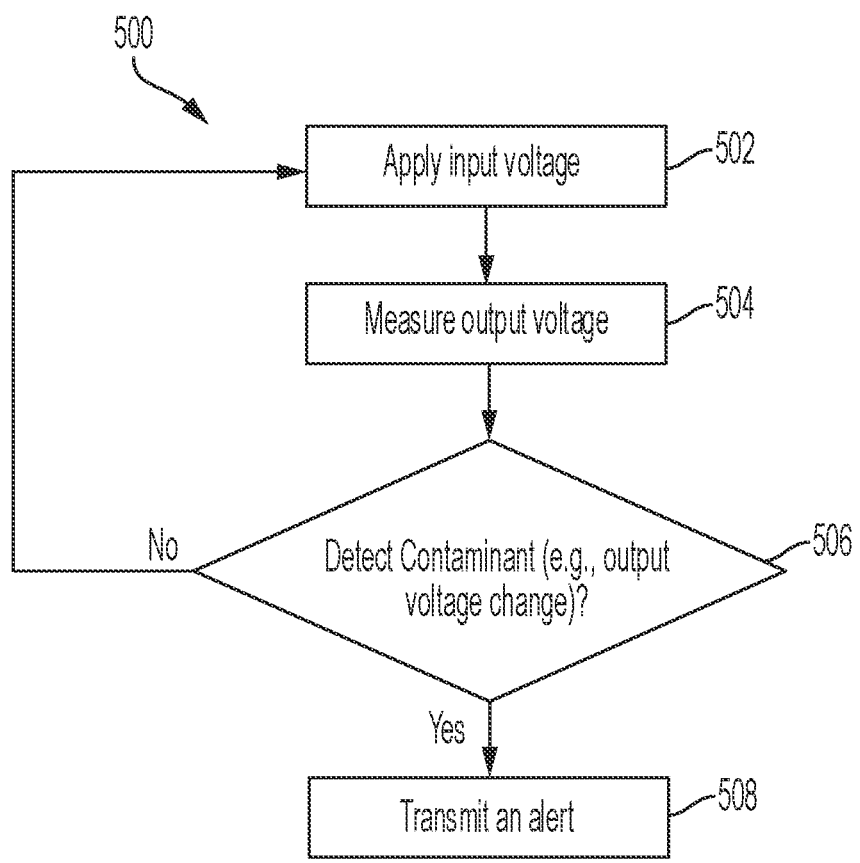
FIG. 5 is a flow chart for detecting a contaminant in metering equipment, according to an embodiment.

FIG. 4 is a schematic diagram of another example of the voltage divider circuit 100 for detecting contamination. In certain instances, excess noise in the contamination circuitry 100 can be mitigated by using a plurality of capacitors 17 (e.g., 17a, 17b, and 17c), electrically coupled in parallel with the variable resistor 13, as shown in FIG. 4.

The variable resistor 13 is designed so that its resistance can vary even in the presence of very small amounts of contamination. Suitable contaminants that may be detected can include water, moisture, humidity, dendrites, dried salts, dirt, oil, or any other organic or inorganic substance. In some embodiments, the contaminant comprises a dendrite or dendrites, which are thin metal connections that can form in electrical circuits in the presence of moisture and an electric field. Dendrites can comprise common metals such as silver, copper, tin, lead or a combination of metals and can cause failures in electrical equipment by short circuits. They can rapidly form, even from a very low amount of moisture/contamination.

In preferred embodiments, the detector 100 serves as a "moisture" detector. As used herein, "moisture" refers to any contaminant containing any detectable amount of water. For example, moisture can refer to humidity (e.g., humid air), condensation (e.g., resulting from the humid air), frozen water (e.g., ice, snow). The water can be substantially free of solutes (e.g., pure water) or, more commonly, it can comprise solutes or exist in another material such as soil, dirt, or organisms. A contaminant detected as "moisture" might be comprised predominantly of water (e.g., condensation) or may be comprised of another substance (e.g., dirt) while having some presence of water. Advantageously, the contaminant detection circuitry 100 can detect the current presence of moisture (e.g., humidity/condensation) or can detect a previous instance of moisture (e.g., dendrites caused by moisture).

As an illustrative example of the function of the present disclosure, pure water has a resistance of 18 MΩ per cm so a droplet of water that would create a connection between the fingers 315a would have a resistance of 360 kΩ. This connection can result in a drop in output voltage (e.g., measured across terminal 14 to ground 18) of about 30%. Any contaminants (e.g., salts or other solutes) in the water will further reduce resistance of the variable resistor 13 and the detected output voltage (e.g., measured across terminal 14 to ground 18). Advantageously, dendrites are a common failure mode of utility meters or meter associated equipment (e.g., the metering equipment 140) and also have very low resistance. In the case of humidity levels within the circuit, as the air becomes more saturated with water, the resistance between the fingers 315a begins to decrease causing the voltage (e.g., measured across terminal 14 to ground 18) to drop as well.

In some embodiments, the contaminant detector 100 is connected to a microprocessor (e.g., the electronic processor 120) that records voltage output at terminal 14 (FIGS. 2-4). The microprocessor 120 is configured to read and interpret the effects of the contamination detection circuitry 100. For example, depending on settings or parameters of the microprocessor 120, the microprocessor's firmware can be configured to detect a level of humidity or to provide a simple indicator of the presence (or absence) of contamination.

As an illustrative example demonstrating humidity detection, a circuit constructed as described herein, was tested for its ability to detect changes in humidity in a humidity chamber that can control both temperature and humidity simultaneously. Referring to the contamination detection circuitry 100 of FIG. 2 as the test circuit, a test voltage of 2.5 V was used as the source voltage 11 across the circuit. Resistors 12 (constant) and 13 (variable) each had an initial resistance of 10 MΩ. Resistor 13 was formed as depicted in FIG. 3 (e.g., with the serpentine shape). Output voltage 14 was measured at 25° C. and 70° C. at relative humidity (%) ranging from 10% to 95%. Results are depicted in Table 1 below.

TABLE 1

| Temperature (C.) | Relative Humidity (%) | Output Voltage (V) |
| --- | --- | --- |
| 70 | 10 | 1.533 |
|  | 25 | 1.533 |
|  | 38 | 1.531 |
|  | 50 | 1.510 |
|  | 60 | 1.459 |
|  | 70 | 1.392 |
|  | 75 | 1.332 |
|  | 80 | 1.093 |
|  | 85 | 0.998 |
|  | 90 | 0.507 |
|  | 95 | 0.061 |
| 25 | 25 | 1.499 |
|  | 38 | 1.499 |
|  | 75 | 1.335 |
|  | 85 | 0.678 |
|  | 95 | 0.212 |

From the test results it can be easily observed that as the humidity level approaches 95% and begins to condense that it is very easy to detect increased levels of contamination. Below 60% relative humidity, the ability to detect moisture is not as apparent. This is primarily because the resistance of the air/water mixture is not low enough to make a large difference in the 10 MΩ resistor. It is to be understood from the test results that one of ordinary skill could affect the sensitivity of the contaminant detector 100 by selecting a different resistance value of resistor 12 and/or a different resistance range of resistor 13. When water or other conductive contaminants are placed directly across the fingers 315a, the effects are very similar to those of the 95% humidity wherein the voltage output is very close to zero.

The contaminant detector 100 is designed for operation for and within a utility meter or a meter transmission unit (e.g., the metering equipment 140). Utility meters are devices that track the usage of a certain utility (i.e., gas, electricity, water) at a location and transmit that information to the company that provides the utility (e.g., utility provider 152) and/or the consumer of the utility. Meter transmission units may transmit data between a utility meter and a utility provider. Often, the data is transmitted in both directions and may comprise utility usage data from one or more utility meters. This enables a utility provider 152 to obtain a high definition view of a utility usage across their distribution system. Both utility meters and utility transmission units are often placed outside and therefore are exposed to ambient weather conditions. This makes them particularly vulnerable to excesses in temperature, humidity, precipitation etc. By including the contaminant detection circuitry 100 inside the utility meter or the meter transmission unit (e.g., the metering equipment 140), both the utility provider 152 and the consumer will be better positioned to detect contamination and act upon it before it becomes a problem.

Fundamentally, a utility meter comprises circuitry configured to monitor consumption of a utility and a housing to contain said circuitry. The housing separates the internal circuitry from external conditions, but can also act as a space to trap humidity/condensation and other contaminants. Therefore, in embodiments, the present disclosure provides a utility meter 140 comprising the housing 142 and circuitry and further comprising a contaminant detector 100 as described herein. Preferably, the contaminant detector 100 is positioned inside the housing 142 (e.g., incorporated as part of the circuitry that detects the usage of the utility).

Also provided is a meter transmission unit 140 comprising the contaminant detector 100. The meter transmission unit (MTU) 140 also comprises circuitry configured to receive and transmit (e.g., via radio unit 130) utility consumption data obtained from a plurality of utility meters 144 and the housing 142 to contain the circuitry. In embodiments, the present disclosure provides the meter transmission unit 140 comprising the housing 142 and circuitry and further comprising a contaminant detector 100 as described herein. In some embodiments, the contaminant detector 100 is positioned inside the housing 142 (e.g., incorporated as part of the circuitry that transmits information between a utility meter 144 and a utility provider 152). The contaminant detector may generate a signal indicative of the detected contaminant.

In embodiments for use within metering equipment, such as a utility meter 140 or meter transmission unit 140 or other meter associated equipment, the metering equipment 140 comprises a housing and circuitry configured to monitor consumption of a utility or, in the case of a meter transmission unit 140, to transmit data between at least one utility meter 144 and a utility provider 152. The contaminant detector 100 comprises a resistive voltage divider 100 including a variable resistor 13 having an overall resistance that varies as a function of contaminant, such that a change in the overall resistance of the variable resistor 13 caused by a contaminant within the housing 142 results in a change in the output voltage measured across the variable resistor 13. As disclosed herein, the change in output voltage is indicative of a contaminant within the housing 142.

The metering equipment 140 (e.g., meter transmission unit and/or utility meter 140) described herein may further comprise the microprocessor 120 capable of detecting changes in the output voltage across variable resistor 13. The microprocessor 120 is configurable to signal or provide an alarm when the output voltage changes significantly (e.g., meets a threshold amount). The microprocessor 120 can further comprise the ADC 122. Thus, line 11, as depicted in FIG. 2, can originate in the microprocessor 120 or ADC convertor 122. In some embodiments, the line 11 is fed by a microprocessor 120 pin set to either high impedance (OFF) or pulled to a reference voltage (e.g., 2.5V). This allows the microprocessor 120 to further reduce the current need on the circuit 100 by only sampling occasionally. Referring again to FIG. 2, line 14, which transmits the output voltage of the circuit 100, can be connected to an analog input pin of the microprocessor 120, allowing the microprocessor 120 to read and interpret the effects of the detection circuit 100. The microprocessor 120 can be configured using firmware to either detect the presence of a contaminant, or in some instances, the relative level of humidity within the housing 142. The microprocessor 120 is further configurable to emit a signal when the output voltage at line 14 changes significantly or falls below a predetermined threshold. For example, the microprocessor 120 can signal when the output voltage falls below a predetermined threshold. The microprocessor 120 may also be configured to record the time and/or date when the contaminant was detected and communicate said information to the utility provider 152.

The microprocessor 120 may comprise a "general-purpose" microprocessor, an application-specific processor (ASIC), a field programmable array (FPA) or a combination of such processing components which may control the general operation of the contaminant detecting device 100 described herein.

Programs or instructions executed by the microprocessor 120 or electronic processor 120 to identify contaminants may be stored in any suitable manufacture that includes one or more non-transitory, tangible, computer-readable media at least collectively storing the executing instructions or routines, such as, but not limited to, the memory devices or storage devices described below. Also these programs encoded on such a computer program product may also include instructions that may be executed by the processor or microprocessor 120 to enable the metering equipment 140 to provide various functionalities, such as communication with the utility provider 152.

Embodiments within the scope of the present disclosure also include computer-readable media (e.g., the memory 124) for carrying or having computer-executable instructions or data structures stored thereon. Such computer-readable media can be any available media that can be accessed by a special purpose computer, including the microprocessor 120 described above, and comprises computer storage media and communication media. For example, instructions or data to be processed by the processor/microprocessor 120 may be stored in a memory 124 or may be stored internal to the processor/microprocessor and/or metering circuitry 132. The memory 124 may store firmware for the contaminant detecting meter transmission unit and/or utility meter 140 such as a basic input/output system (BIOS), an operating system, various programs, applications or any other routines that may be executed on the meter transmission unit and/or utility meter 140, including user interface functions, processor functions, audio alteration functions, media playback functions and so forth. The memory 124 may be optional if the processor 120 is capable of storing such information and/or firmware in its internal memory. For example, in embodiments where the meter transmission unit and/or utility meter 140 is not being powered by an external power source and is operating only on battery power, the processor/microprocessor 120 may be programmed to sample from the contaminant detecting circuit 100 only intermittently. The processor/microprocessor 120 may wake from a sleep mode to store information relating to the presence of a contaminant in the housing 142 in its internal memory to conserve energy and then power back down to a sleep mode until the meter transmission unit and/or utility meter 140 is powered back on.

In embodiments, the contaminant detected comprises a conductive substance (defined herein as anything having less resistant than the "non-conductive material"). In the presence of said conductive substance, the resistance of the variable resistor 13 decreases, thereby reducing the output voltage of the circuit at line 14. This decrease in output voltage can be detected via the microprocessor 20 contained within the housing 142 as discussed.

As discussed above, the contaminant detector 100 of the present disclosure can operate using very low current. In normal operation, therefore, the meter transmission unit and/or utility meter 140 may apply less than 200 nA towards measuring contaminants. Even in the event of a fault, the contaminant detector 100 is designed to draw no more than 360 nA. Advantageously, the microprocessor 120 can be configured to sample from the contaminant detection circuit 100 intermittently (as opposed to continuously), to minimize current usage.

The contaminant detector 100, as described above, can be prepared using a printed circuit board (PCB) and therefore easily positioned anywhere within the housing 142 of the meter transmission unit and/or utility meter 140. As a representative example, FIG. 3 depicts the contaminant detector embodied by the voltage divider circuit 100 positioned within a circuit board of a meter transmission unit. The contaminant detector may advantageously be positioned in areas particularly prone to contamination as determined by one of ordinary skill.

As mentioned, the utility meter and/or meter transmission unit 140 described herein may comprise a circuit board configured to support at least a processor 120 configured to control the operation of at least a portion of the metering or transmission circuitry and the contaminant detection circuitry 100. In some cases, different processors 120 may be used for controlling the operation of the meter transmission unit and/or utility meter 140 and detecting the contaminants.

In addition to the embodiments described above, embodiments of the present disclosure may comprise a special purpose computer including a variety of computer hardware, as described in greater detail below. By way of example, and not limitation, computer storage media include both volatile and nonvolatile, removable and non-removable media implemented in any method or technology for storage of information such as computer readable instructions, data structures, program modules or other data. Computer storage media are non-transitory and include, but are not limited to, random access memory (RAM), read only memory (ROM), electrically erasable programmable ROM (EEPROM), compact disk ROM (CD-ROM), digital versatile disks (DVD), or other optical disk storage, solid state drives (SSDs), magnetic cassettes, magnetic tape, magnetic disk storage, or other magnetic storage devices, or any other medium that can be used to carry or store desired non-transitory information in the form of computer-executable instructions or data structures and that can be accessed by a computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which aspects of the disclosure may be implemented. Although not required, aspects of the disclosure will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represent examples of corresponding acts for implementing the functions described in such steps.

Those skilled in the art will appreciate that aspects of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Aspects of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing aspects of the disclosure includes a special purpose computing device in the form of a conventional computer, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory computer storage media, including nonvolatile and volatile memory types. A basic input/output system (BIOS), containing the basic routines that help transfer information between elements within the computer, such as during start-up, may be stored in ROM. Further, the computer may include any device (e.g., computer, laptop, tablet, PDA, cell phone, mobile phone, a smart television, and the like) that is capable of receiving or transmitting an IP address wirelessly to or from the internet.

The computer may also include a magnetic hard disk drive for reading from and writing to a magnetic hard disk, a magnetic disk drive for reading from or writing to a removable magnetic disk, and an optical disk drive for reading from or writing to removable optical disk such as a CD-ROM or other optical media. The magnetic hard disk drive, magnetic disk drive, and optical disk drive are connected to the system bus by a hard disk drive interface, a magnetic disk drive-interface, and an optical drive interface, respectively. The drives and their associated computer-readable media provide nonvolatile storage of computer-executable instructions, data structures, program modules, and other data for the computer. Although the exemplary environment described herein employs a magnetic hard disk, a removable magnetic disk, and a removable optical disk, other types of computer readable media for storing data can be used, including magnetic cassettes, flash memory cards, digital video disks, Bernoulli cartridges, RAMs, ROMs, SSDs, and the like.

Communication media typically embody computer readable instructions, data structures, program modules or other data in a modulated data signal such as a carrier wave or other transport mechanism and includes any information delivery media.

One or more aspects of the disclosure may be embodied in computer-executable instructions (i.e., software), routines, or functions stored in system memory or nonvolatile memory as application programs, program modules, and/or program data. The software may alternatively be stored remotely, such as on a remote computer with remote application programs. Generally, program modules include routines, programs, objects, components, data structures, etc. that perform particular tasks or implement particular abstract data types when executed by a processor in a computer or other device. The computer executable instructions may be stored on one or more tangible, non-transitory computer readable media (e.g., hard disk, optical disk, removable storage media, solid state memory, RAM, etc.) and executed by one or more processors or other devices. As will be appreciated by one of skill in the art, the functionality of the program modules may be combined or distributed as desired in various embodiments. In addition, the functionality may be embodied in whole or in part in firmware or hardware equivalents such as integrated circuits, application specific integrated circuits, field programmable gate arrays (FPGA), and the like.

Preferably, computer-executable instructions are stored in a memory, such as the hard disk drive, and executed by the computer. Advantageously, the computer processor has the capability to perform all operations (e.g., execute computer-executable instructions) in real-time.

The contaminant detector 100 described herein is preferably housed within a utility meter or meter transmission unit. The utility meter can comprise a housing 142 and metering circuitry 132 for quantifying usage of a utility located therein. Any meter can be adapted to contain the contaminant detector 100 described herein. For example, the utility meter 140 described herein may comprise an electricity meter, a water meter, a heat meter, a gas meter or any combination thereof.

The meter transmission unit 140 can comprise housing 142 and circuitry 130 for receiving and transmitting information between one or more utility meters 144 and a utility provider 152. In addition, the meter transmission unit 140 can be configurable to enable one or two way communication with a utility company 152. In certain embodiments, the meter transmission unit 140 comprises a meter transmission unit from the STAR Network (Aclara Technologies, LLC). The STAR network is a two-way communication system consisting of meter transmission units (MTUs), data collection units (DCUs) and network control computers (NCCs). Meter transmission units 140 for this system that may be developed with the contaminant detector 100 include the ACLARA RF 3300 water MTU series, the STAR 3300 water MTU series, the START NETWORK3000 gas MTU series, the ACLARA RF 3000 gas MTU series, the ACLARA RF 3400 Water MTU series, STAR Network Electric MTU series, an RF electric meter transmission unit (Aclara). In addition, utility meters or meter transmission units described in US Patent No. 917458, U.S. Pat. Nos. 8,325,057, 5,877, 703, or U.S. Pat. No. 6,072,405, incorporated herein by reference, can be used.

It is noted that one of ordinary skill in the art may immediately envision other devices that may benefit from a contaminant detector described herein. For example, any electrical system or device required to function reliably outside over an extended period of time with little maintenance may be equipped with a contaminant detector described herein. In addition, any device associated with the detection and communication of utility usage can be equipped with a contaminant detector within the embodiments of the present disclosure.

Also provided herein are methods of detecting a contaminant in metering equipment 140, such as a utility meter or meter transmission unit, the method comprising (step 502) applying a voltage across a resistive voltage divider circuit 100, housed within the utility meter and/or meter transmission unit 140 or other meter associated equipment, the resistive voltage divider circuit 100 comprising a variable resistor 13 having an overall resistance that varies as a function of the contaminant. An output voltage is measured (step 504) from the resistive voltage divider 100, wherein a change in the output voltage is indicative of the presence of the contaminant (step 506). When a measured output voltage has not changed according to a specified level, the electronic processor 120 may proceed to step 502 or may wait a specified time period and proceed to step 502. The resistive voltage divider 100 comprises a constant resistor 12 and a variable resistor 13, a voltage source and an output voltage detector (e.g., the microprocessor 120). The variable resistor 13 can comprise a serpentine structure having a plurality of detection fingers formed of a conductive material (e.g., printed circuit board) surrounded by non-conductive material, wherein the overall resistance of the variable resistor 13 when the serpentine structure is in contact with the contaminant is different than when the serpentine structure is not in contact with the contaminant.

In some embodiments, the methods provided herein can detect contaminants having a lower resistance than a "non-conductive material". Therefore, in said embodiments, the overall resistance of the variable resistor 13 when the serpentine structure (FIG. 3) is in contact with the contaminant will be reduced compared to when the serpentine structure is not in contact with the contaminant. In these embodiments, a reduction in output voltage will be indicative of contamination. Thus, the method can further comprise (step 508) emitting an alarm or sending a signal if the output voltage falls below a predetermined threshold.

In some embodiments, the method comprises detecting the presence of dendrites or moisture in metering equipment 140. Thus, in embodiments, the contaminant comprises water or metal. The metal can comprise silver, copper, tin, lead or a combination thereof. In some embodiments, the contaminant comprises humid air (e.g., humidity) and the method further comprises detecting levels of humidity inside the utility meter. Other suitable contaminants that may be detected can include water, moisture, humidity, dendrites, dried salts, dirt, oil, or any other organic or inorganic substance.

The contaminant detection system and method have a number of advantages, such as being sensitive enough to detect minute changes in contaminants. This allows early detection and treatment of the contamination—an essential feature for devices relied upon to transmit utility data across a distribution system with little maintenance. Further, since the system draws very little current, it is ideal for use in battery powered conditions such as in utility meter equipment. Finally, its simple design allows it to be positioned easily in areas at high risk of contamination within a circuit.

The order of execution or performance of the operations in embodiments of the present disclosure illustrated and described herein is not essential, unless otherwise specified. That is, the operations may be performed in any order, unless otherwise specified, and embodiments of the present disclosure may include additional or fewer operations than those disclosed herein. For example, it is contemplated that executing or performing a particular operation before, contemporaneously with, or after another operation is within the scope of aspects of the present disclosure.

Embodiments of the present disclosure may be implemented with computer-executable instructions. The computer-executable instructions may be organized into one or more computer-executable components or modules. Aspects of the present disclosure may be implemented with any number and organization of such components or modules. For example, aspects of the present disclosure are not limited to the specific computer-executable instructions or the specific components or modules illustrated in the figures and described herein. Other embodiments of the present disclosure may include different computer-executable instructions or components having more or less functionality than illustrated and described herein.

When introducing elements of aspects of the present disclosure or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the present disclosure in detail, it will be apparent that modifications and variations are possible without departing from the scope of aspects of the present disclosure as defined in the appended claims. As various changes could be made in the above constructions, products, and methods without departing from the scope of aspects of the present disclosure, it is intended that all matter contained in the above description and shown in the accompanying drawings shall be interpreted as illustrative and not in a limiting sense.

What is claimed is:

1. A contaminant detecting device comprising:
    an electronic processor; and
    a resistive voltage divider, the resistive voltage divider comprising a constant resistor electrically connected in series with a variable resistor and a voltage source thereacross, wherein an overall resistance of the variable resistor varies in response to contact with a contaminant, such that an output voltage of the resistive voltage divider varies in response to the contaminant,
    wherein the electronic processor is configured to receive the output voltage and generate an output in response to the output voltage exceeding a predetermined threshold.

2. The contaminant detecting device of claim 1, wherein the resistance of the variable resistor where in contact with the contaminant is less than an overall resistance of the variable resistor where the variable resistor is not in contact with the contaminant such that when contacted with the contaminant the overall resistance of the variable resistor decreases, thus decreasing an output voltage of the resistive voltage divider.

3. The contaminant detecting device of claim 1, wherein when the variable resistor is in contact with the contaminant the overall resistance of the variable resistor decreases, thus decreasing an output voltage of the resistive voltage divider.

4. The contaminant detecting device of claim 1, wherein the variable resistor comprises a serpentine structure having a plurality of fingers formed from a conductive material separate by a non-conductive substance.

5. The contaminant detecting device of claim 4, wherein the conductive material comprises a conductive trace formed on a printed circuit board (PCB) having non-conductive material electrically isolating the plurality of detective fingers from neighboring electrical components.

6. The contaminant detecting device of claim 1, wherein the contaminant comprises water or a metal.

7. The contaminant detecting device of claim 1 further comprising, one or more capacitive devices connected in parallel with the variable resistor.

8. The contaminant detecting device of claim 1, wherein the electronic processor comprises an analog to digital converter, wherein the electronic processor is configured to read the output voltage of the of the resistive voltage divider and determine a presence of a contaminant based on the output voltage.

9. The contaminant detecting device of claim 1 further comprising a radio unit, wherein the electronic processor is configured to transmit, via the radio unit, a signal indicating the presence of the contaminant.

10. A method of detecting a contaminant in metering equipment, the method comprising:
    applying a voltage across a contaminant detection circuit, the contaminant detection circuit housed within the metering equipment, and comprising a variable resistive element having a resistance that varies in response to the contaminant and a constant resistive element serially coupled to the variable resistive element to form a voltage divider circuit; and
    measuring an output voltage from the resistive voltage divider, wherein the output voltage indicates a presence of the contaminant.

11. The method of claim 10, wherein the variable resistive element comprises a serpentine structure comprising a plurality of fingers formed from conductive material separated by a non-conductive substance, wherein the overall resistance of the variable resistive element when the serpentine structure is in contact with the contaminant is different than when the serpentine structure is not in contact with the contaminant.

12. The method of claim 11, wherein the contaminant comprises a substance having less resistance than the non-conductive substance so that the overall resistance of the variable resistive element when the serpentine structure is in contact with the contaminant is less than the overall resistance of the variable resistive element when the serpentine structure is not in contact with the contaminant, and wherein a decrease in the output voltage is indicative of the presence of the contaminant.

13. A method of detecting a contaminant in a housing for utility metering equipment, the method comprising:
    applying a voltage across a contaminant detection circuit, the contaminant detection circuit housed within the metering equipment, and comprising a variable resistive element having a resistance that varies in response to the contaminant;
    measuring an output voltage from the resistive voltage divider the contaminant detection circuit, wherein a decrease in the output voltage is indicative of the presence of the contaminant, and
    detecting the output voltage by a microprocessor and emitting an alarm or sending a signal indicative of the contaminant within the utility housing in response to the output voltage falling below a predetermined threshold.

14. The method of claim 13, wherein the contaminant comprises water or metal.

15. The method of claim 14, wherein the contaminant comprises water or metal.

16. The method of claim 14 further comprising, detecting the output voltage by a microprocessor and emitting an alarm or sending a signal indicative of the contaminant within the utility housing in response to the output voltage falling below a predetermined threshold.

17. The method of claim 13, wherein the variable resistive element comprises a serpentine structure comprising a plurality of fingers formed from conductive material separated by a non-conductive substance, wherein the overall resistance of the variable resistive element when the serpentine structure is in contact with the contaminant is different than when the serpentine structure is not in contact with the contaminant.

18. The method of claim 17, wherein the contaminant comprises a substance having less resistance than the non-conductive substance so that the overall resistance of the variable resistive element when the serpentine structure is in contact with the contaminant is less than the overall resistance of the variable resistive element when the serpentine structure is not in contact with the contaminant, and wherein a decrease in the output voltage is indicative of the presence of the contaminant.

* * * * *